(12) United States Patent
Blais et al.

(10) Patent No.: US 6,904,673 B1
(45) Date of Patent: Jun. 14, 2005

(54) CONTROL OF FLUX BY INK STOP LINE IN CHIP JOINING

(75) Inventors: Claude Blais, Granby (CA); Julie Nadeau Filteau, St-Augustin de Desmaures (CA); Pierre M. Langevin, Granby (CA); Robert L. Toutant, St-Paul d'Abbotsford (CA); Alain Warren, Canton de Granby (CA)

(73) Assignee: International Business Machines Corporation, Armonk, NY (US)

( * ) Notice: Subject to any disclaimer, the term of this patent is extended or adjusted under 35 U.S.C. 154(b) by 99 days.

(21) Appl. No.: 10/253,666

(22) Filed: Sep. 24, 2002

(51) Int. Cl.[7] ................................................. H05K 3/34
(52) U.S. Cl. .............................. 29/840; 29/841; 29/843; 29/855; 156/182; 728/223; 356/237.1; 427/8
(58) Field of Search ......................... 29/840, 841, 843, 29/855; 156/182; 728/223; 356/237.1; 427/8

(56) References Cited

U.S. PATENT DOCUMENTS

| | | |
|---|---|---|
| 4,859,808 A | 8/1989 | Jeter et al. |
| 4,898,117 A | 2/1990 | Ledermann et al. |
| 4,934,309 A | 6/1990 | Ledermann et al. |
| 5,111,279 A | 5/1992 | Pasch et al. |
| 5,218,234 A | 6/1993 | Thompson et al. |
| 5,299,730 A | 4/1994 | Pasch et al. |
| 5,410,805 A | 5/1995 | Pasch et al. |
| 5,415,337 A * | 5/1995 | Hogan et al. ............... 228/223 |
| 5,936,310 A | 8/1999 | Wensel |
| 6,056,189 A * | 5/2000 | Gao et al. ................... 228/207 |
| 6,283,360 B1 | 9/2001 | Kumai et al. |
| 6,324,754 B1 | 12/2001 | DiStefano et al. |
| 6,597,444 B1 * | 7/2003 | Halderman et al. ....... 356/237.1 |

FOREIGN PATENT DOCUMENTS

| | | |
|---|---|---|
| EP | 0588241 A2 | 3/1994 |
| JP | 01170090 A2 | 7/1989 |
| JP | 03129830 A2 | 6/1991 |
| JP | 200349416 A2 | 12/2000 |
| JP | 2001005399 A2 | 1/2001 |
| JP | 2001168509 A2 | 6/2001 |

* cited by examiner

*Primary Examiner*—Carl J. Arbes
*Assistant Examiner*—Tim Pham
(74) *Attorney, Agent, or Firm*—Lisa J. Ulrich

(57) ABSTRACT

Ink jet printing apparatus is employed to form a non-polar ink stop line around a chip site on the polar surface of an organic laminate substrate. The non-polar ink stop line acts to confine polar liquid flux from spreading after application of the flux to the chip site prior to chip joining. Excessive flux spreading results in insufficient flux being present at the chip site for the formation of good electrical connections during solder reflow upon chip joining.

14 Claims, 4 Drawing Sheets

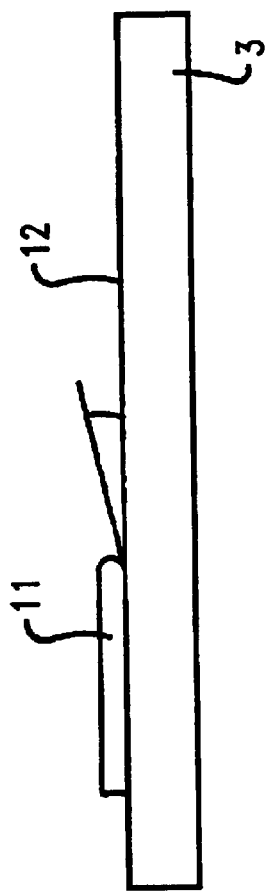
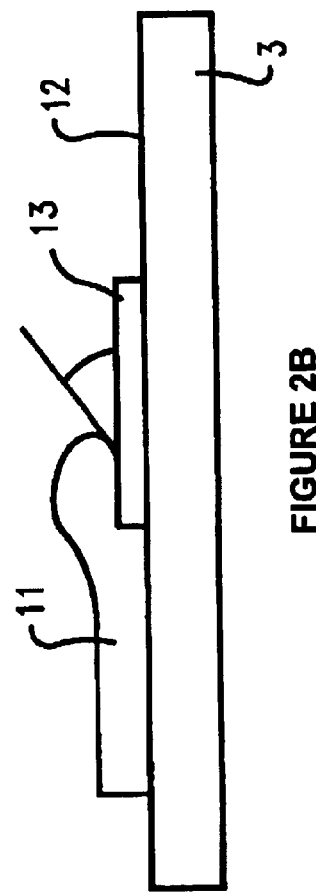
FIGURE 2A
FIGURE 2B

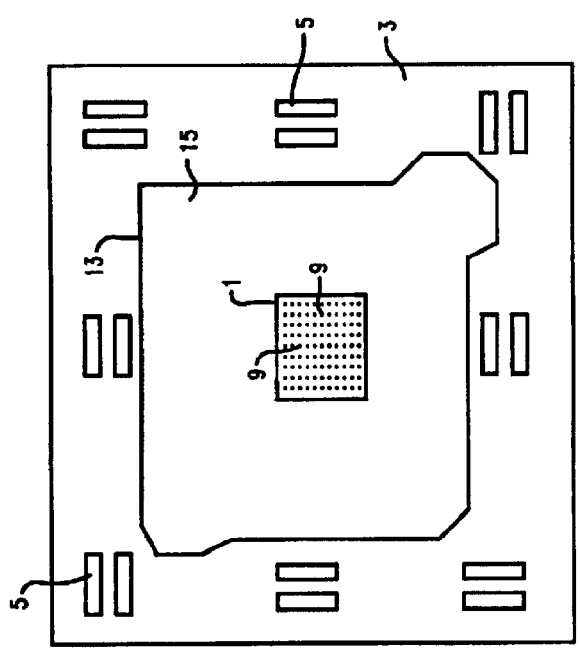
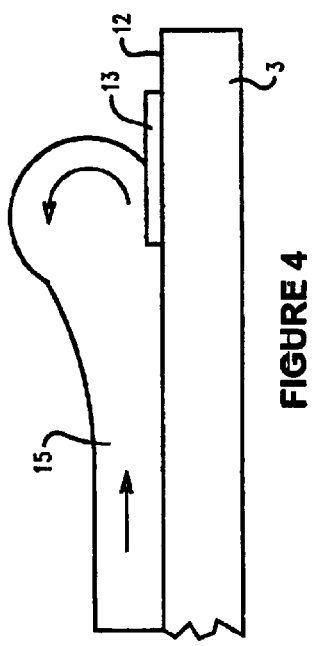

CONTROL OF FLUX BY INK STOP LINE IN CHIP JOINING

BACKGROUND OF THE INVENTION

1. Field of the Invention

The present invention relates to electronic assemblies and further to electronic component attachment to a substrate in the manufacture of such assemblies. More particularly, the present invention relates to chip attachment, such as, flip chip joining to a substrate.

2. Background and Related Art

Typical conventional processes for joining a chip to a substrate involve applying flux to the substrate at the chip site and placing the chip with solder bumps on the substrate at such site. Heat is then applied such that the flux reacts with the joining pads on the substrate and, thereafter, the solder bumps on the chip melt in the presence of the flux thereby joining the chip to the substrate joining pads. Typical of such processes is that known as the C-4 process.

Variations of such processes are also known. For example, various pretreatment and post-treatment steps may be employed. Typical of the pretreatment steps are those used to pretreat the substrate surface with a plasma. Such steps may be necessary, for example, to make organic substrates, such as laminates, more wettable. Such steps may be undertaken to alleviate problems, such as, adhesion of underfill after the chip joining operation.

However, it has been found that organic laminate substrates, particularly plasma pretreated laminate substrates, tended to result in more frequent improper joining of the chip solder bumps to the substrate joining pads. Although initially the cause of such improper joining was unclear, it has been discovered that excessive spreading of the flux caused a lack of flux where needed at the joining pads. Applying more flux to the chip site on the substrate tends to create other problems, such as, the floating and movement of the chip.

Thus, one of the difficulties with laminate surfaces, and particularly those that have been plasma pretreated, is that their wettable surface characteristics create conditions which result in excessive flux spreading. Excessive flux spreading, in turn, reduces the amount of flux at the chip site necessary to make good electrical connection upon solder reflow during chip attachment.

It is known in the art to use various forms of bulk barriers and dams which act to inhibit, at various points in the process, the spreading of various fabricating materials, such as, epoxy underfills and encapsulating materials. Often, such barriers are relatively viscous materials of such bulk so as to prevent the flow of the material to be controlled. It is also known to use low wetting dams to confine materials, such as, solder paste or surface bonding material.

Such techniques, however, can be cumbersome and costly to carry out. For example, use of such techniques typically requires removal of the dam material after processing. Where dams are not removed, their presence may interfere with subsequent operations. Moreover, application of the dam material is difficult to control, and limited space on the substrate surface may prohibit their effective use. In addition, such known processes and techniques most often do not have general utility but are limited in their application to the specific problem solved thereby.

SUMMARY OF THE PRESENT INVENTION

Accordingly, it is an object of the present invention to provide an improved method and apparatus for attaching electronic devices to substrates therefor.

It is a further object of the present invention to provide an improved semiconductor assembly and method of fabricating same.

It is yet a further object of the present invention to provide an improved method of joining semiconductor chips to a substrate.

It is another object of the present invention to provide a method for improving electrical connections between chip solder bumps and substrate joining pads.

It is yet another object of the present invention to provide an improved method of controlling flux used in joining semiconductor chips to a substrate.

In accordance with the present invention, a flux control method, structure and apparatus therefor are employed to overcome excessive flux spreading. Excessive flux spreading results in insufficient flux at the chip joining site thereby causing improper joining of chip solder bumps to substrate joining pads.

Control of flux is achieved by depositing a narrow line of non-polar ink on a substrate using an ink jet apparatus as employed, for example, in industrial inkjet printing. The line may be configured in any desired shape to generally circumscribe the chip site. The width of the line may be controlled to be the minimum necessary to electrochemically control the flux. The height of the line is nominally that as provided by ink jet printing apparatus.

The cured line of ink provides a non-polar, high surface tension surface and, therefore, a high angle of contact, to the polar flux material spreading over the polar, low surface tension surface of the substrate. Stated another way, the non-polar ink stop line presents a solid surface the molecules of which have a smaller attraction to the molecules of the liquid polar flux material (adhesive force) than the attraction of the polar-like flux material molecules have for each other (cohesive force).

Inks used in industrial ink jet printing applications are typically made of polyphenolic materials. Such inks materials generally have hydroxyl groups (—OH) and thus such dried inks present a non-polar surface and, therefore, a high angle of contact or wetting angle with polar flux materials. The addition of materials, such as fluorine, to the polyphenolic material further increases the wetting angle of polar flux material.

These foregoing and other objects, features and advantages of the invention will be apparent from the following more particular description of a preferred embodiment of the invention, as illustrated in the accompanying drawings, wherein like reference numbers represent like parts of the invention.

BRIEF DESCRIPTION OF THE DRAWING

FIG. 2A shows an enlarged cross-section of the organic laminate substrate with flux spreading due to low surface tension and result ant low contact angle.

FIG. 2B shows an enlarged cross-section of the organic laminate substrate with flux spreading limited due to the high surface tension and resultant high contact angle caused by the cured non-polar ink stop line.

FIG. 3 shows a top view of a chip site on an organic laminate substrate surrounded by a non-polar ink stop line.

FIG. 4 shows an enlarged partial cross-section of the organic laminate substrate with flux spreading toward the cured non-polar ink stop line.

DETAILED DESCRIPTION

Figure 1:
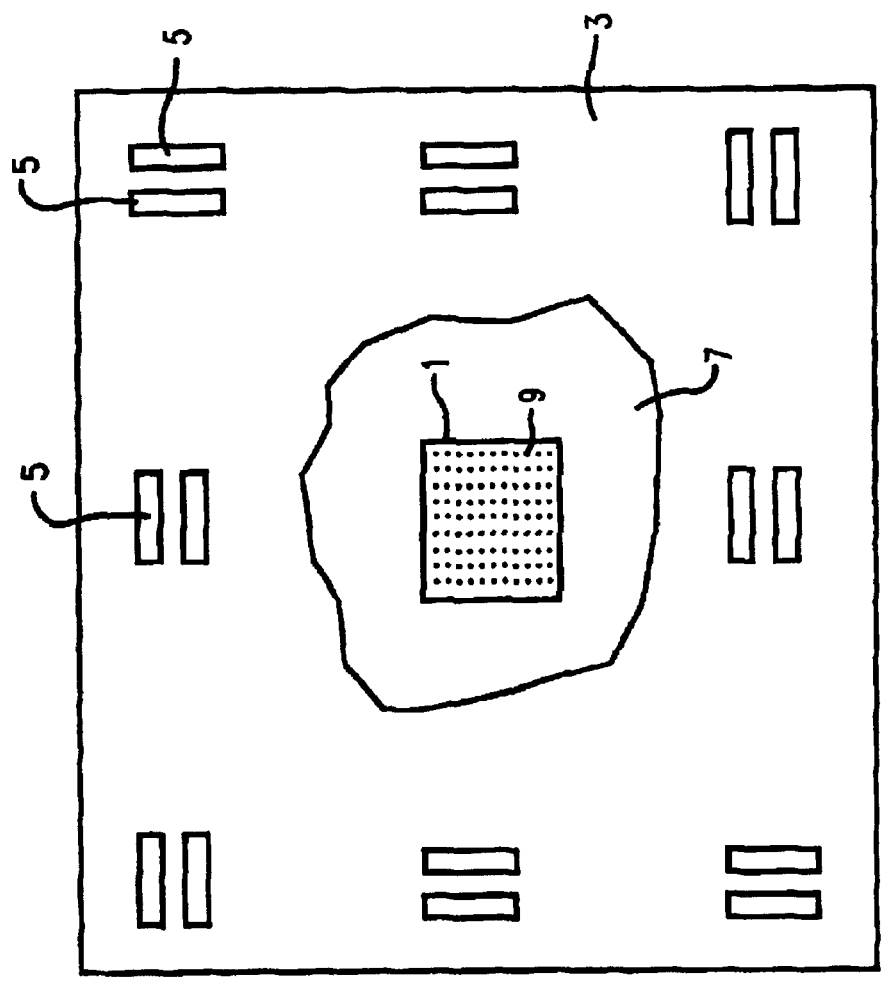
FIG. 1 shows a top view of a chip site on an organic laminate substrate.

With reference to FIG. 1, there is shown a typical chip site 1 on an organic surface laminar circuitry (SLC) laminate substrate 3. Also shown is an array of other electrical components sites 5, such as, capacitor sites. The irregular shaped region 7 represents the area of flux as spread from the chip site. The array of points 9 represent substrate joining pads.

In the process of attaching a chip to the chip site 1 on substrate 3, a flux is applied to the chip site prior to chip placement and application of heat for chip attachment. With the application of heat, the flux reacts with joining pads on substrate 1 and thereafter the solder bumps on the chip melt, in the presence of flux, to thereby electrically join the chip to the substrate pads. The solder bumps may be C-4 solder bumps. It is clear, that other arrangements may be employed as, for example, attaching chip pads to solder bumps positioned on the substrate.

This standard chip joining process has been further modified by pretreating the substrate surface with a plasma to overcome adhesion problems of chip underfill after the chip joining process. It has been found, however, that such pretreated substrates tended to result in additional improper electrical joining of the chip solder bumps to the substrate joining pads. In accordance with the present invention, it has been also found that lack of sufficient flux at the chip site caused the improper electrical joining of the chip to the substrate. Moreover, it has been determined that providing additional flux at the chip site merely creates additional problems of chip floating and movement at the chip site, in addition to further flux spreading.

In accordance with the present invention, it is known that relatively non-viscous polar flux materials readily wet the polar surface of organic laminate substrates. In this regard, certain flux materials, in addition to their other components, may also contain a high percentage of solvent (up to 75%), such as, isopropylic alcohol, thereby giving it a highly non-viscous polar characteristic. Although organic laminate substrates are readily wet by such fluxes, the pretreatment of the bare substrate with plasma makes the substrate even more wettable. Thus, as shown in FIG. 1, with the application of such fluxes to the chip site, the flux readily spreads outwardly from the chip site resulting in insufficient flux at the site to make good electrical connection. As shown, because of the wettability of the organic laminate substrate by the polar flux material, the flux region 7 spreading pattern is not uniform around chip site 1. The flux may even spread to electrical component sites 5 causing chemical interference resulting in electrical defects in the components.

FIG. 2A shows flux 11 on substrate 3 with its low contact angle on the plasma treated surface 12 thereof. Because the molecules of the polar flux material exhibit a larger adhesive force with the molecules of the polar laminate substrate than the cohesive force of the flux molecules themselves, the flux easily spreads with its edge forming a low contact angle with the substrate.

In accordance with the present invention and as shown in FIG. 2B, a thin, low profile non-polar ink stop line 13 formed on surface 12 of substrate 3 acts to present a non-polar surface to polar flux material 11 which surface results in lowering the adhesive force therebetween such that the cohesive force between the flux molecules is greater than the adhesive force thereby resulting in a high contact angle between ink stop 13 line and the edge of flux material 11.

In accordance with the present invention, FIG. 3 shows a top view of organic laminate substrate 3 with a non-polar ink stop line 13 surrounding chip site 1. The non-polar ink stop line is printed on the substrate 3 by a commercially available ink jet printing head, as used, for example, to apply identification marks to electronic parts. An example of such ink jet head is that made by Videojet Inc. It is known that such apparatus are capable of precisely controlling the line width and location of the print. Typical line widths for such apparatus range from around 0.25 mm to 0.75 mm. Line heights are typically less than 10 microns. The ink stop line may first be deposited upon an organic laminate substrate before bake out. After depositing the ink stop line on the laminate, the laminate is heat treated in a bake out process to remove moisture from the laminate structure and at the same time cure the ink.

As is clear, the configuration of the ink stop line 13 may be arranged to meet the requirements of the particular application. Thus, the ink stop line 13 configuration is arranged to be sufficiently removed from chip site 1 so that the chip underfill operation, after chip attachment, can be carried out without contacting ink stop line 13. It is known that the chip underfill not only forms between chip and substrate, but it also extends out to wet the four edges of the chip to form a fillet of underfill material. Because of the limited space in high density packaging, any flux control structure needs to be of minimal width within the resulting space constraints. It is also known that the deposit of underfill on some form of barrier used to control flux spreading will weaken the underfill adhesion material to the laminate substrate surface. This weakening of underfill adhesion material is due to the lower adhesion strength of the underfill on the barrier as compared to its adhesion on the laminate substrate surface. The poor adhesion resulting from underfill on the barrier may therefore act as a delaminating initiator.

Thus, the configuration of ink stop line 13 is such as to leave room for chip underfill and yet avoid allowing the flux to make contact with other electrical components on the substrate. This is readily achieved using ink jet printing apparatus thereby avoiding complex, costly and cumbersome techniques, such as, by using extruding, masking, screen printing, pouring, etc. The limited width required by the ink stop line, in accordance with the present invention, makes its use effective in high density packaging applications. In this regard, the limitation on the width of the ink stop line is that it cannot be made so narrow that it is no longer deposited to effectively form a continuous ink stop line.

It is known that commercially available industrial ink jet printing ink used to mark electronic parts for identification, for example, is typically made of polyphenolic materials with hydroxyl groups (—OH). An example of such ink is that sold by Videojet Inc. designated videojet ink 16-5900. Such inks exhibit a non-polar surface, when deposited, which surface further exhibits a high wetting or contact angle with polar flux materials. However, such ink surfaces exhibit even higher wetting or contact angles with their inclusion of additives that reduce its surface energy. Materials of a fluorinated carbon (—$CF_2$—)X—$CH_3$ or ($CH_2$)X—$CF_3$, or a combination of these, act to further reduce the surface energy of the ink. Also, a long hydrocarbon chain ($CH_2$)X—$CH_3$, such as paraffin or silane with a long hydrocarbon chain, will also work to further reduce surface energy. The silane acts to fix itself to the surface and the long hydrocarbon chain (4 to 20 carbons) will orient itself vertically and will lower the surface energy. However, molecules containing fluorine are preferred. It has been found that fluorine in commercially available polyphenolic ink, acts to create a non-polar surface when deposited that increases the wetting angle with water up to 96 degrees, and exhibits a concentration of fluorine at the surface of the ink in the range of 24%. Concentration in the bulk of the ink can be very low since the fluorine will concentrate at the surface thereby significantly reducing its surface energy. The surface energy is reduced such as to provide a sufficiently high surface tension and resulting high contact angle so as to effectively stop flux 15 from spreading, as shown in FIG. 4. As a result, enough flux is allowed to accumulate at the chip site sufficient to meet proper chip attachment requirements.

Figure 5A:
FIGS. 5A–5C show enlarged views of flux spreading during the fluxing process.
Figure 5B:
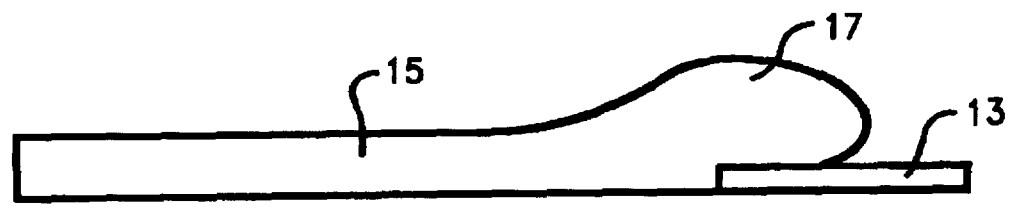
Figure 5C:
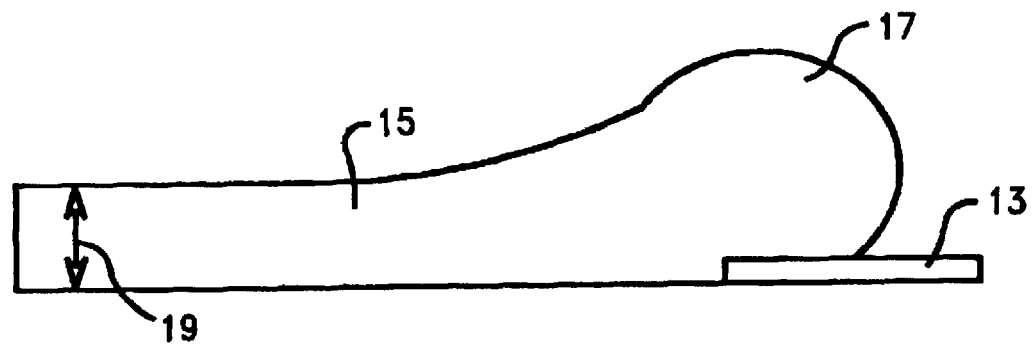

FIGS. 5A–5C further depict the chip fluxing process. As shown in FIG. 5A, non-polar flux material 15 readily spreads on the surface (not shown) of the polar laminate substrate until it meets cured ink stop line 13. As shown in FIG. 5B, non-polar ink stop line 13 has a sufficiently high surface tension so as to act as an efficient hydrophobic surface and repel the flux sufficiently to allow accumulation of flux material on the substrate surface behind the adhesion-formed mass 17 of flux material. As shown in FIG. 5C, the thickness 19 of accumulated flux 15 is sufficient to provide an effective shot size for complete chip joining resulting in good electrical contact at the chip site. It is clear that in dispensing flux material at the chip site, that enough flux must be dispensed to allow sufficient accumulation but that beyond a certain critical value, the flux will spill over the ink stop line. This is the point where the liquid pressure of the flux exceeds the surface tension, i.e., adhesive force, of the non-polar ink stop line.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A method for joining a chip to a substrate, comprising:
   providing a substrate having a plurality of joining pads at a substrate surface including chip joining pads at a chip joining site;
   forming a line of ink material including fluorine around said chip joining pads on said substrate surface to create an ink stop line having a non-polar surface to confine soldering flux applied at said chip joining site;
   applying soldering flux to said chip joining site wherein said flux is confined by said ink stop line so as to limit flux spreading and thereby maintain sufficient flux at said chip site;
   placing a chip with solder bumps on said chip joining site; and
   heating said substrate so that said flux reacts with said joining pads at said chip site and said solder bumps on said chip melt in the presence of said flux to thereby electrically join said chip to said substrate.

2. The method as set forth in claim 1 wherein said step of forming a line of ink comprises forming said line of ink by ink jet apparatus.

3. The method as set forth in claim 1 wherein said substrate is an organic laminate substrate and wherein at least the portion of the said surface of said laminate substrate around said chip site is pretreated with plasma to thereby make said surface more wettable.

4. The method as set forth in claim 1 wherein said substrate chip joining pads include solder bumps.

5. The method as set forth in claim 1 wherein said step of placing said chip with said solder bumps comprises first attaching said solder bumps to said joining pads at said chip site on said substrate.

6. The method as set forth in claim 1 wherein said step of forming an ink stop line includes forming an ink stop line pattern so as to separate said chip joining pads from the rest of said plurality of joining pads.

7. The method as set forth in claim 1 wherein said ink stop line is between 0.25 mm and 0.75 mm wide.

8. The method as set forth in claim 1 wherein said ink material is a polyphenolic ink material including fluorine.

9. A method of joining a chip to a substrate, comprising:
   providing an organic laminate substrate having a plurality of joining pads arranged thereon including chip joining pads at a chip site;
   plasma treating the surface of said substrate;
   using ink jet apparatus to form an ink stop line on said substrate around said chip site with said ink stop line having a non-polar surface;
   applying soldering flux to said chip site such that said flux is confined by said ink stop line to thereby retain sufficient flux at said chip site to provide effective solder joint connection to said joining pads;
   positioning a chip with solder bumps at said chip site aligned with said chip joining pads; and
   heating said substrate to electrically join said chip to said substrate.

10. The method as set forth in claim 9 wherein said ink stop line is between approximately 0.25 mm and 0.75 mm wide.

11. The method as set forth in claim 10 wherein said ink stop line separates said chip joining pads from the other of said plurality of joining pads.

12. The method as set forth in claim 11 wherein said ink comprises a polyphenolic material including a fluorinated carbon.

13. The method as set forth in claim 12 wherein the concentration of said fluorinated carbon is higher at the surface of said ink stop line than in the body of said ink stop line.

14. The method as set forth in claim 13 wherein said ink stop line remains on said substrate.

* * * * *